US009223765B1

(12) United States Patent
Alakuijala et al.

(10) Patent No.: US 9,223,765 B1
(45) Date of Patent: Dec. 29, 2015

(54) ENCODING AND DECODING DATA USING CONTEXT MODEL GROUPING

(71) Applicant: GOOGLE INC., Mountain View, CA (US)

(72) Inventors: Jyrki Antero Alakuijala, Adliswil (SE); Zoltan Szabadka, Adliswil (SE)

(73) Assignee: Google Inc., Mountain View, CA (US)

(*) Notice: Subject to any disclaimer, the term of this patent is extended or adjusted under 35 U.S.C. 154(b) by 301 days.

(21) Appl. No.: 14/050,049

(22) Filed: Oct. 9, 2013

(51) Int. Cl.
*H03M 7/00* (2006.01)
*G06F 17/22* (2006.01)
*G06F 17/28* (2006.01)

(52) U.S. Cl.
CPC ............ *G06F 17/2217* (2013.01); *G06F 17/28* (2013.01)

(58) Field of Classification Search
CPC ....... H03M 7/42; H03M 7/3084; G06F 17/28; G06F 17/2217
USPC .................................. 341/107, 51, 50, 67, 65
See application file for complete search history.

(56) References Cited

U.S. PATENT DOCUMENTS

| 6,320,522 | B1* | 11/2001 | Satoh | H03M 7/40 341/51 |
| 7,016,547 | B1* | 3/2006 | Smirnov | H03M 7/40 375/E7.144 |
| 8,791,843 | B2* | 7/2014 | Cohen | H03M 7/3079 341/51 |
| 9,009,655 | B2* | 4/2015 | Shinjo | G06F 17/30221 717/106 |
| 9,129,001 | B2* | 9/2015 | Qian | G06F 17/30153 |

OTHER PUBLICATIONS

"Stochastic Optimization", Wikipedia, the free encyclopedia, Jun. 17, 2013, 4 pages.
Deutsch, "DEFLATE Compressed Data Format Specification" version 1.3, Network Working Group, May 1996, 17 pages.
Huffman, "A Method for the Construction of Minimum-Redundancy Codes", Proceedings of the I.R.E., Sep. 1952, pp. 1098-1101.
Marpe, et al, "Context-Based Adaptive Binary Arithmetic Coding in the H.264/AVC Video Compression Standard", IEEE Transactions on Circuits and Systems for Video Technology, vol. 13, No. 7, Jul. 2003, pp. 620-636.
Mrak, et al, "A Context Modeling Algorithm and Its Application in Video Compression", Proc. ICIP 2003, Sep. 14-17, 4 pages.
Tan, et al, "Cluster Analysis: Basic Concepts and Algorithms", Introduction to Data Mining, Chapter 8, 2006, pp. 496-497.

* cited by examiner

*Primary Examiner* — Peguy Jean Pierre
(74) *Attorney, Agent, or Firm* — Brake Hughes Bellermann LLP

(57) ABSTRACT

A non-transitory computer-readable storage medium comprising instructions stored thereon. When executed by at least one processor, the instructions may be configured to cause a computing system to at least determine, for each of a plurality of current symbols in a data block, frequencies of succeeding symbols within the data block, generate a plurality of clusters, each of the plurality of clusters including a subset of the plurality of current symbols, generate, for each of the clusters, a code, the code including variable length codewords for each of the succeeding symbols of the current symbols included in the respective cluster, and encode each of the succeeding symbols in the data block based on the code for the cluster that includes the succeeding symbol's respective current symbol.

27 Claims, 13 Drawing Sheets

FIG. 3A

| File 300 | Data Block 302 | Data Block 304 | Data Block 306 | Data Block 308 |
|---|---|---|---|---|

FIG. 3B

| Data Block 302 | h Symbol 310 | a Symbol 312 | p Symbol 314 | p Symbol 316 | y Symbol 318 | - Symbol 320 | h Symbol 322 | i Symbol 324 | p Symbol 326 | - Symbol 328 | h Symbol 330 | o Symbol 332 | p Symbol 334 |
|---|---|---|---|---|---|---|---|---|---|---|---|---|---|

FIG. 3C

| Data Block 350 | Preceding Symbol 352 | Current Symbol 354 | Succeeding Symbol 356 | ... |
|---|---|---|---|---|

| h Successor Table 402 | Symbol | Frequency |
|---|---|---|
| | a | 1 |
| | i | 1 |
| | o | 1 |

FIG. 4A

| a Successor Table 404 | Symbol | Frequency |
|---|---|---|
| | p | 1 |

FIG. 4B

| p Successor Table 406 | Symbol | Frequency |
|---|---|---|
| | p | 1 |
| | y | 1 |
| | _ | 1 |

FIG. 4C

| y Successor Table 408 | Symbol | Frequency |
|---|---|---|
| | _ | 1 |

FIG. 4D

| _ Successor Table 410 | Symbol | Frequency |
|---|---|---|
| | h | 2 |

FIG. 4E

| i Successor Table 412 | Symbol | Frequency |
|---|---|---|
| | p | 1 |

FIG. 4F

| o Successor Table 414 | Symbol | Frequency |
|---|---|---|
| | p | 1 |

FIG. 4G

First Cluster Table 502

| Current symbols: a, p, y, i, o | | |
|---|---|---|
| Succeeding Symbol | Frequency | Codeword |
| p | 4 | 0 |
| y | 1 | 10 |
| _ | 2 | 11 |

FIG. 5A

Second Cluster Table 504

| Current symbols: h, _ | | |
|---|---|---|
| Succeeding Symbol | Frequency | Codeword |
| a | 1 | 00 |
| i | 1 | 01 |
| o | 1 | 10 |
| h | 2 | 11 |

FIG. 5B

ENCODING AND DECODING DATA USING CONTEXT MODEL GROUPING

BACKGROUND

Transmitting large amounts of data can consume significant communication and/or networking resources. The format of representation of the data can affect the resources required to transmit the data.

SUMMARY

This description relates to compressing and decompressing data.

According to one general aspect, a non-transitory computer-readable storage medium may include instructions stored thereon. When executed by at least one processor, the instructions may be configured to cause a computing system to at least determine, for each of a plurality of current symbols in a data block, frequencies of succeeding symbols within the data block, generate a plurality of clusters, each of the plurality of clusters including a subset of the plurality of current symbols, generate, for each of the clusters, a code, the code including variable length codewords for each of the succeeding symbols of the current symbols included in the respective cluster, and encode each of the succeeding symbols in the data block based on the code for the cluster that includes the succeeding symbol's respective current symbol.

According to another general aspect, a non-transitory computer-readable storage medium may include instructions stored thereon. When executed by at least one processor, the instructions may be configured to cause a computing system to at least decode a first variable number of bits that encode a current symbol based on a first code, the first code being associated with a first plurality of symbols including a previously decoded symbol that was decoded before the current symbol, and decode a second variable number of bits that encode a succeeding symbol based on a second code, the second code being associated with a second plurality of symbols including the current symbol but not the previously decoded symbol.

A non-transitory computer-readable storage medium may include instructions stored thereon. When executed by at least one processor, the instructions may be configured to cause a computing system to at least group current symbols from a first data block into a first plurality of clusters based on frequency distributions of succeeding symbols within the first data block, generate entropy codes for each of the first plurality of clusters based on frequency distributions of the succeeding symbols of the current symbols in the respective cluster, and encode the succeeding symbols from the first data block based on the entropy codes of the clusters of their respective current symbols within the first data block.

The details of one or more implementations are set forth in the accompanying drawings and the description below. Other features will be apparent from the description and drawings, and from the claims.

BRIEF DESCRIPTION OF THE DRAWINGS

FIG. 3A is a diagram of a file according to an example implementation.

FIG. 3B is a diagram of a data block according to an example implementation.

FIG. 3C is a diagram of a data block showing relationships between a preceding symbol, a current symbol, and a succeeding symbol, according to an example implementation.

FIGS. 4A, 4B, 4C, 4D, 4E, 4F, and 4G show tables with frequencies of successor symbols for current symbols according to an example implementation.

FIGS. 5A and 5B show tables with frequencies and codewords for successor symbols of clusters of current symbols according to an example implementation.

DETAILED DESCRIPTION

Figure 1:
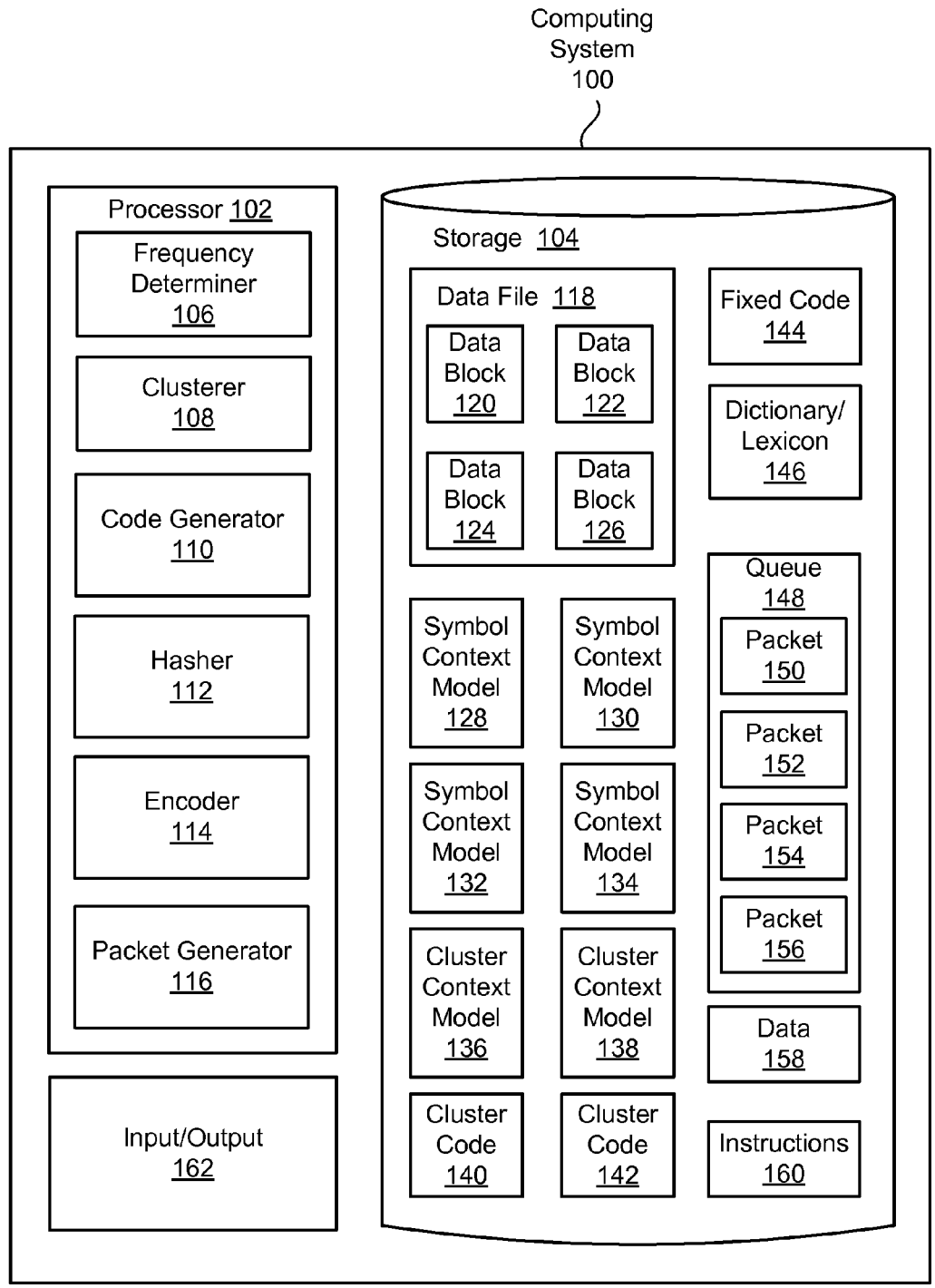
FIG. 1 is a diagram of a computing system for encoding data according to an example implementation.

FIG. 1 is a diagram of a computing system 100 for encoding data according to an example implementation. The computing system 100 may determine codes for symbols included in a data file, and encode the symbols according to the determined code. For each symbol in the file, which may be considered a "current symbol" at each iteration, the computing system 100 may determine frequencies of "succeeding symbols," which succeed or come after the current symbols. A current symbol may be considered the "context" of a succeeding symbol, or with respect to a current symbol, a "preceding symbol" may be considered the context. The symbols may include any symbol, character, or word recognized and processed by the computing system 100, such as American Standard for Information Interchange (ASCII) characters, Unicode characters, or words, such as words recognized in an English dictionary or lexicon or words recognized in a Chinese dictionary or lexicon. The computing system 100 may generate clusters based on the succeeding symbols for each of the current symbols, generate code for each of the clusters based on the frequencies of the succeeding symbols of the current symbols within the respective clusters, and encode each of the current symbols based on the code for the cluster of which the preceding symbol is included. The codes may be variable length codes such as Huffman codes. The encoding based on the context may reduce the length of codewords required to encode most of the symbols, reducing the resources required to transmit the data and/or symbols.

The computing system 100 may include a processor 102. The processor 102 may be capable of executing instructions and performing operations to perform the methods and functions described herein.

The processor 102 may include a frequency determiner 106. The frequency determiner 106 may determine frequencies of symbols within a data file or within a data block. The frequency determiner 106 may also determine frequencies of succeeding symbols with respect to current symbols. The frequency determiner 106 may, for example, generate a table or other representation indicating the frequencies of succeeding symbols that succeed each current symbol. Examples of tables showing frequencies of succeeding symbols for example current symbols are shown in FIGS. 4A, 4B, 4C, 4D, 4E, 4F, and 4G. The frequency determiner 106 may also generate tables indicating frequencies of succeeding symbols of multiple current symbols, such as multiple current symbols included in a cluster. The frequency determiner 106 may, for each succeeding symbol of at least one of the current symbols in the cluster, add the frequencies with respect to each of the current symbols, to determine a total or aggregate frequency of the succeeding symbols.

The processor 102 may include a clusterer 108. The clusterer 108 may cluster current symbols based on the frequencies of succeeding symbols. The clusterer 108 may cluster current symbols together which have similar frequencies of succeeding symbols. The clusterer 108 may perform, for example, K-means clustering or stochastic optimization of the current symbols based on their determined frequencies of succeeding symbols to group the current symbols into clusters.

The processor 102 may include a code generator 110. The code generator 110 may generate a code for each cluster that will be used to encode symbols that are preceded by symbols within the respective cluster. The code generator 110 may generate the codes based on the frequencies determined for the respective clusters. The code generator 110 may generate a variable length code, including an entropy code such as Huffman code, for encoding the data.

The processor 102 may include a hasher 112. The hasher 112 may hash a given symbol to a code and/or cluster. The hasher 112 may hash the symbol to the code and/or cluster so that a computing device, such as an encoder 114 of the computing system 100, will be able to encode the symbol according to the appropriate code. The hasher 112 may hash a preceding symbol to determine the context of the symbol, and the context may be associated with a code and/or cluster used to encode a current symbol. In an example in which the number of clusters and/or codes is small, the cluster and/or code may be determined by checking the context and/or preceding symbol against a lookup table instead of by hashing the context and/or preceding symbol.

The processor 102 may include an encoder 114. The encoder 114 may encode symbols based on the code for the cluster associated with a preceding symbol. The encoder 114 may determine the code by hashing the preceding symbol to a value associated with the code and/or cluster used to encode the current symbol, or may determine the code and/or cluster based the preceding symbol without hashing the preceding symbol. The encoder 114 may determine a codeword to encode each current symbol by checking the codeword against a lookup table associated with the code and/or cluster, such as the tables shown in FIGS. 5A and 5B.

The processor 102 may include a packet generator 116. The packet generator 116 may generate packets including the encoded symbols. The packet generator 116 may also add header information, such as information used to reconstruct the code including frequencies, to the packets, so that a computing device that receives the encoded data may decode the encoded data. The packet generator 116 may also add header information such as addressing information, and may also add trailer information, such as error detection and/or correction information.

The computing system 104 may include one or more storage devices 104. The storage device(s) 104 may include a non-transitory computer-readable storage medium.

The storage device(s) 104 may include a data file 118. The data file 118 may include a plurality of symbols. The plurality of symbols may be represented according to an encoding format, such as a fixed length encoding format including ASCII or an encoding format for Unicode characters such as UTF-8 or UTF-16. The data file 118 may be broken into a plurality of data blocks 120, 122, 124, 126. The data blocks 120, 122, 124, 126 may each include a portion of the data file 118. The data blocks 120, 122, 124, 126 may each include a plurality of symbols, and may all be a same size, or may be different sizes.

The storage device(s) 104 may include symbol context models 128, 130, 132, 134 for each current symbol in the data file 118. The symbol context models 128, 130, 132, 134 may store frequencies of succeeding symbols for each current symbol in the data file and/or data block. The frequency determiner 106 may generate the symbol context models 128, 130, 132, 134. The symbol context models 128, 130, 132, 134 may be generated for each data block 120, 122, 124, 126. Examples of symbol context models 128, 130, 132, 134 are shown in FIGS. 4A, 4B, 4C, 4D, 4E, 4F, and 4G.

The storage device(s) 104 may include cluster context models 136, 138. The cluster context models may include frequencies of succeeding symbols for clusters of current symbols that have been clustered. The frequency determiner 106 may generate the cluster context models 136, 138. Examples of cluster context models 136, 138 are shown in the first two columns of FIGS. 5A and 5B.

The storage device(s) 104 may also include cluster codes 140, 142. The cluster codes 140, 142 may each be associated with a cluster context model 136, 138, and/or may be associated with a cluster of current symbols generated by the clusterer 108. The cluster codes 140, 142 may include codes, such as variable length codes including entropy codes such as Huffman codes, for encoding data based on preceding symbols. Examples of the cluster codes 140, 142 are shown in the third columns of FIGS. 5A and 5B.

The storage device(s) 104 may store one or more fixed codes 144. The computing system 100 may use the fixed code 144 to decode data included in the data file 118. The fixed code 144 may include ASCII, Unicode, or another fixed code for encoding and decoding data and/or symbols.

The storage device(s) 104 may also include a dictionary and/or lexicon 146. The dictionary and/or lexicon 146 may include words in specified languages, such as words in the English language. The dictionary and/or lexicon 146 may include recognized words in one or more languages, and may index the recognized words for easier retrieval. The hasher 112 may hash index number that identify words in a dictionary or lexicon to a cluster, frequency distribution, or code.

The storage device(s) 104 may also include a queue 148. The queue 148 may store packets 150, 152, 154, 156. The queue 148 may store packets 150, 152, 154, 156 for either transmission or reception. The queue 148 may store packets 150, 152, 154, 156 which are generated by the packet generator 116.

The storage device(s) 104 may also include data 158. The data 158 may include data stored by the computing system 100 in addition to and/or including data previously described. The storage device(s) 104 may also include instructions 160. The instructions 160 may include instructions executed by the processor 102 to perform any of the methods and/or functions described herein.

The computing system 100 may also include an input/output device 162. The input/output device 162 may receive and/or transmit data, such as in packet form.

Figure 2:
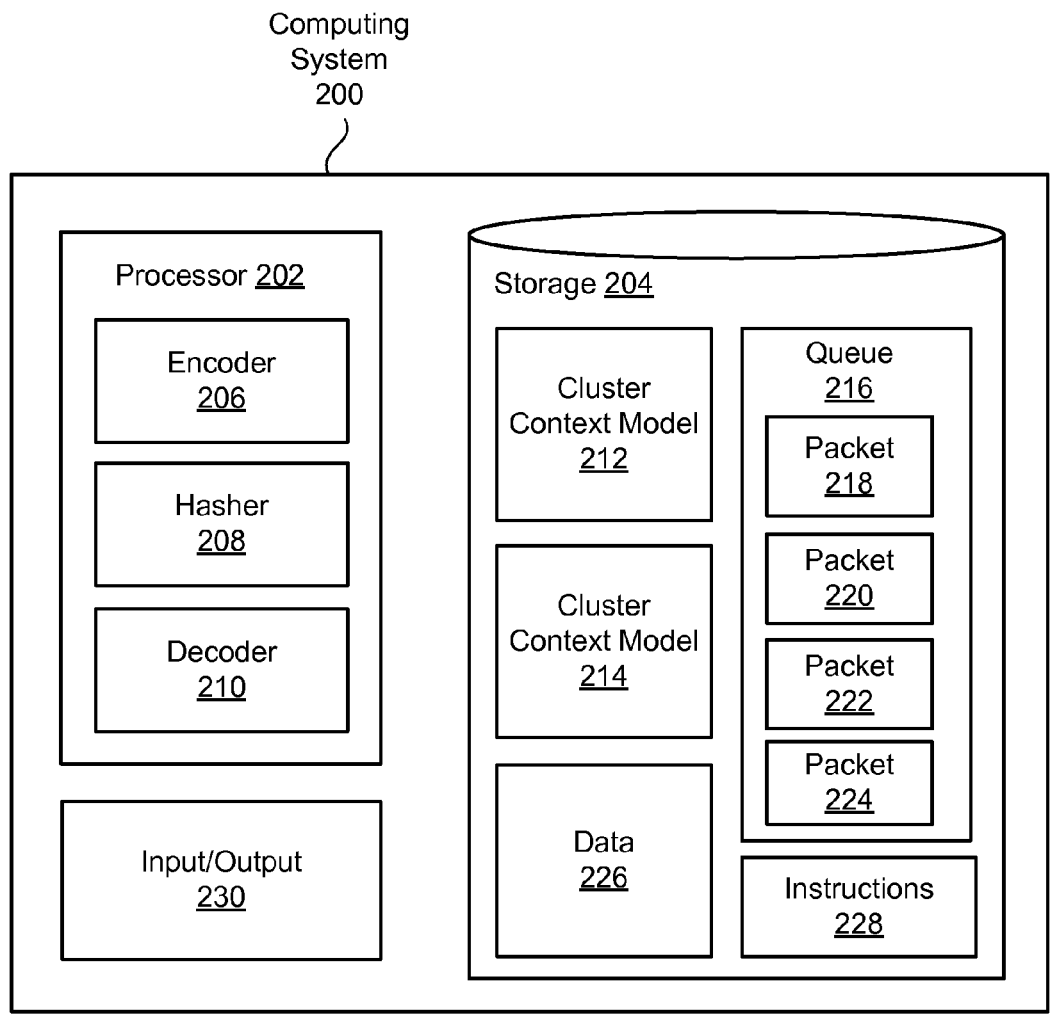
FIG. 2 is a diagram of a computing system for decoding data according to an example implementation.

FIG. 2 shows a computing system 200 for decoding data according to an example implementation. The computing system 200 may receive and decode data, such as data received from the computing system 100. The computing system 200 may include a processor 202. The processor 102 may be capable of executing instructions and performing operations to perform the methods and functions described herein.

The processor 202 may include an encoder 206. The encoder 206 may encode data in a similar manner to the encoder 114 described above with respect to the computing system 100. The encoder 206 may also generate a code based on received frequency distributions. The generated code may be used to decode received encoded data.

The processor 202 may also include a hasher 208. The hasher 208 may hash symbols to codes and/or clusters to determine the code to decode the received encoded data, according to an example implementation. A decoder 210 may use the hash value determined by the hasher 208 to determine a code to decode the received data. In another example implementation, the computing system 200 may determine a code and/or cluster to decode a current symbol based on the preceding symbol, without hashing the preceding symbol.

The processor 202 may include a decoder 210. The decoder 210 may decode received data. The decoder 210 may decode received data based on a code associated with a context of a current symbol, a preceding symbol, and/or a cluster including the preceding symbol. The code may include a variable length code including an entropy code such as Huffman code. The code may, for example, include a lookup table, such as the tables shown in FIGS. 5A and 5B, matching codewords to symbols.

The computing system 200 may include one or more storage devices 204. The storage device(s) 204 may include cluster context models 212, 214. The computing system 200 may receive the cluster context models 212, 214 from the computing system 100. While two cluster context models 212, 214 are shown in FIG. 2, any number of context models 212, 214 may be received and stored by the computing system 200. The cluster context models 212, 214 may include frequencies of succeeding symbols, such as the frequencies associated with the cluster context models 136, 138 of the computing system 100. The encoder 206 may use the codes and/or frequency distributions included in the cluster context models 212, 214 to generate codes for decoding received data.

The storage device(s) 204 may include a queue 216. The queue 216 may store packets 218, 220, 222, 224. The packets 218, 220, 222, 224 stored by the queue 216 may be received from the computing system 100, and may include encoded data that is decoded by the decoder 210.

The storage device(s) 204 may also include data 226. The data 226 may include data in addition to the data described above. The storage 204 device(s) may also include instructions 228. The instructions 228 may include instructions executable by the processor 202 to perform the methods and functions described herein.

The computing system 200 may also include an input/output device 230. The input/output device 230 may receive and transmit packets, such as the packets 218, 220, 222, 224.

FIG. 3A is a diagram of a file 300 according to an example implementation. The file 300 may be an example of the file 118 described above with respect to FIG. 1, and may include data and/or symbols encoded according to a format, such as ASCII or Unicode, or an index to words in a dictionary or lexicon. The file 300 may include a plurality of data blocks 302, 304, 306, 308. While four data blocks 302, 304, 306, 308 are shown in FIG. 3A, any number of data blocks may be included in the file 300.

FIG. 3B is a diagram of the data block 302 according to an example implementation. While FIG. 3B shows seven unique symbols ('h', 'a', 'p', 'y', ' ', 'i', 'o'), some of which are repeated in the thirteen symbols 'h' 310, 'a' 312, 'p' 314, 'p' 316, 'y' 318, ' ' 320, 'h' 322, 'i' 324, 'p' 326, ' ' 328, 'h' 330, 'o' 332, 'p' 334 shown in FIG. 3B, this is merely an example. The data block 302 may include many more than thirteen symbols 310, 312, 314, 316, 318, 320, 322, 324, 326, 328, 330, 332, 334 according to example implementations. In this example, the symbol 310 includes an 'h', the symbol 312 includes an 'a', the symbol 314 includes 'p', the symbol 316 includes a 'p', the symbol 318 includes a 'y', the symbol 320 includes a space (' ' or '_'), the symbol 32 includes an 'h', the symbol 324 includes an 'i', the symbol 326 includes a 'p', the symbol 328 includes a space, the symbol 330 includes an 'h', the symbol includes 332 includes an 'o', and the symbol 334 includes a 'p'. This is merely an example. Many other symbols may be included in the data block 302.

While the symbols shown in FIG. 3B include alphabetical characters, the symbols may also include characters from other alphabets, or may include words from one or multiple languages. For example, the symbols may include characters from a first alphabet and a second alphabet, or any number of alphabets. In another example, the symbols may include words recognized by a dictionary or lexicon of a first language, and words recognized by a dictionary or lexicon of a second language.

FIG. 3C is a diagram of a data block 350 showing relationships between a preceding symbol 352, a current symbol 354, and a succeeding symbol 356, according to an example implementation. The data block 350 may include any of the data blocks 302, 304, 306, 308 shown and described with respect to FIG. 3A.

The data block 350 is shown merely for illustrative purposes. The data block may include stateless symbols. Stateless symbols may be symbols which are not related to any other symbol. In the example shown in FIG. 3C, the data block 350 may include a current symbol 354. The data block 350 may also include a preceding symbol 352 that precedes the current symbol 354 and a succeeding symbol 356 that succeeds or comes after the current symbol 354. The preceding symbol may come immediately before the current symbol 354 and/or immediately precede the current symbol 354. The succeeding symbol 356 may come immediately after the current symbol 354 and/or immediately succeed the current symbol 354.

Returning to FIG. 3B, with respect to symbol 310 as a current symbol, symbol 312 is a succeeding symbol; with respect to symbol 312 as a current symbol, symbol 314 is a succeeding symbol; with respect to symbol 314 as a current symbol, symbol 316 is a succeeding symbol; with respect to symbol 316 as a current symbol, symbol 318 is a succeeding symbol; with respect to symbol 318 as a current symbol, symbol 320 is a succeeding symbol; with respect to symbol 320 as a current symbol, symbol 322 is a succeeding symbol; with respect to symbol 322 as a current symbol, symbol 324 is a succeeding symbol; with respect to symbol 324 as a current symbol, symbol 326 is a succeeding symbol; with respect to symbol 326 as a current symbol, symbol 328 is a succeeding symbol; with respect to symbol 328 as a current symbol, symbol 330 is a succeeding symbol; with respect to symbol 330 as a current symbol, symbol 332 is a succeeding symbol; and with respect to symbol 332 as a current symbol, symbol 334 is a succeeding symbol. With respect to symbol 312 as a current symbol, symbol 310 is a preceding symbol; with respect to symbol 314 as a current symbol, symbol 312 is a preceding symbol; with respect to symbol 316 as a current symbol, symbol 314 is a preceding symbol; with respect to symbol 318 as a current symbol, symbol 316 is a preceding symbol; with respect to symbol 320 as a current symbol, symbol 318 is a preceding symbol; with respect to symbol 322 as a current symbol, symbol 320 is a preceding symbol; with respect to symbol 324 as a current symbol, symbol 322 is a preceding symbol; with respect to symbol 326 as a current symbol, symbol 324 is a preceding symbol; with respect to symbol 328 as a current symbol, symbol 326 is a preceding symbol; with respect to symbol 330 as a current symbol, symbol 328 is a preceding symbol; with respect to symbol 332 as a current symbol, symbol 330 is a preceding symbol; and with respect to symbol 334 as a current symbol, symbol 332 is a preceding symbol. The first symbol in the data block 302, symbol 310, does not have a preceding symbol. The last symbol in the data block 302, symbol 334, does not have a succeeding symbol.

FIGS. 4A, 4B, 4C, 4D, 4E, 4F, and 4G show tables with frequencies of successor symbols for current symbols according to an example implementation. These tables are examples of the symbol context models 128, 130, 132, 134 described above with respect to FIG. 1. While the tables shown in FIGS. 4A, 4B, 4C, 4D, 4E, 4F, and 4G show frequencies only for succeeding symbols with a frequency of at least 1, the computing device 100 may determine and store frequency tables, or similar representations, with values of zero for succeeding symbols that do not occur after the given current symbols.

FIG. 4A shows an 'h' successor table 402 according to an example implementation. There are three instances of 'h' as a symbol in the example data block 302 shown in FIG. 3B, namely in symbol 310, symbol 322, and symbol 330. The symbol 312, which includes 'a', is a succeeding symbol of symbol 310. The symbol 324, which includes 'i', is a succeeding symbol of symbol 322, and the symbol 322, which includes 'o', is a succeeding symbol of symbol 330. As a result, the h successor table 402 includes the symbol 'a' as a successor symbol with a frequency of 1; the symbol 'i' as a successor symbol with a frequency of 1, and the symbol 'o' as a successor symbol with a frequency of 1.

FIG. 4B shows an 'a' successor table 404 according to an example implementation. In this example as shown in FIG. 3B, the symbol 'a' occurs only once at symbol 312, and includes one succeeding symbol 314, 'p'. As a result, the a successor table 404 includes one successor symbol, 'p', with a frequency of 1.

FIG. 4C includes a 'p' successor table 406 according to an example implementation. In this example, with the exception of symbol 334, which is the last symbol in the data block 302 and has no successor symbol, the symbol 'p' occurs 3 times in the data block 302, namely in symbol 314, symbol 316, and in symbol 326. In this example, the symbol 314 has a successor symbol 'p' at symbol 316, the symbol 316 has the symbol 'y' as a successor symbol at symbol 318, and the symbol 326 has the symbol ' ' as the successor symbol at symbol 328. As a result, the 'p' successor table 406 includes the symbol 'p' with a frequency of 1, the symbol 'y' with a frequency of 1, and the symbol space, ' ', or '_' with a frequency of 1.

FIG. 4D shows an example of a 'y' successor table 408 according to an example implementation. As shown in FIG. 3B, the symbol 'y' occurs once at symbol 318. The symbol 318 has one successor symbol, space, ' ', or '_' at symbol 320. As a result, the 'y' successor table 408 includes one symbol, the space, with a frequency of 1.

FIG. 4E shows a space successor table 410 according to an example implementation. As shown in FIG. 3B, the symbol space occurs twice in the data block 302; at symbol 320 and at symbol 328. As shown in FIG. 3B, the symbol 'h' is a successor symbol to the space at symbol 322, and the symbol 'h' is a successor to the symbol 328 at symbol 330. As a result, the blank successor table 410 includes a single symbol 'h' with a frequency of 2.

FIG. 4F shows an 'i' successor table 410 according to an example implementation. As shown in FIG. 3B, the symbol 'i' occurs once in the data block 302 at symbol 324. The symbol 324 is succeeded by the symbol 'p' at symbol 326. As a result, the i successor table 412 includes the symbol 'p' with a frequency of 1.

FIG. 4G includes an 'o' successor table 414 according to an example implementation. As shown in FIG. 3B, the symbol o occurs once in the data block 302, at symbol 332. The symbol 332 includes the successor symbol 'p' at symbol 334. As a result, the 'o' successor table 414 includes the single symbol 'p' with a frequency of 1.

In an example implementation, the context may be generated based on N preceding symbols, where N may be any positive integer, such as one, two, three, four, five, or six. In the examples shown in FIGS. 4A, 4B, 4C, 4D, 4E, 4F, and 4G, N is equal to one, and the context was generated based on one preceding symbol. However, the context may be generated based on combinations of preceding symbols, which may result in a larger number of frequency tables; each frequency table may indicate frequencies of single succeeding symbols after the combination of N preceding symbols, or may indicate frequencies of combinations of multiple succeeding symbols after the combination of N preceding symbols, according to example implementations.

The clusterer 108 may cluster the successor tables 402, 404, 406, 408, 410, 412, 414. The clusterer 108 may cluster the successor tables 402, 404, 406, 408, 410, 412, 414 based on the frequency values for the successor symbols. The clusterer 108 may generate clusters so that each current symbol, such as the symbols 'h', 'a', 'p', 'y', ' ', 'i', and 'o', is included in one and only one of the clusters. The clusterer 108 may generate the clusters of current symbols based on the succeeding symbols of the current symbols. The clusterer 108 may, for example, generate the clusters of current symbols that the clusters include current symbols with similar frequencies of their succeeding symbols. The clusters may, for example, include current symbols with similar frequency values for their succeeding symbols, such as similar successor tables 402, 404, 406, 408, 410, 412, 414.

The clusterer 108 may, for example, treat each of the successor tables 402, 404, 406, 408, 410, 412, 414 as points in multidimensional space. The multidimensional space may include dimensions corresponding to the successor symbols. In this example, the multidimensional space may include seven dimensions, corresponding to the successor symbols 'h', 'a', 'p', 'y', ' ', 'i', and 'o'. The values for the points or successor tables 402, 404, 406, 408, 410, 412, 414 along each of these dimensions range from zero to two; in examples with greater numbers of symbols, the number of dimensions may be greater and the values may have a much greater range. In the examples shown in FIGS. 4A, 4B, 4C, 4D, 4E, 4F, and 4G, the frequency values and/or values for the corresponding dimensions for successor symbols that are not shown are zero. The clusterer 108 may group successor tables 402, 404, 406, 408, 410, 412, 414, and/or corresponding points in multidimensional space, into a same cluster based on their proximity to each other and/or to a center of the cluster within the multidimensional space. The clusterer 108 may also group successor tables 402, 404, 406, 408, 410, 412, 414, and/or corresponding points in multidimensional space, based on density clustering, clustering one or more group of successor tables 402, 404, 406, 408, 410, 412, 414 together into one or more clusters based on the density of the successor tables 402, 404, 406, 408, 410, 412, 414 with respect to each other, and grouping remaining successor tables 402, 404, 406, 408, 410, 412, 414 into another cluster based on the remaining successor tables' 402, 404, 406, 408, 410, 412, 414 lack of density in the multidimensional space.

In the example shown in FIGS. 4A, 4B, 4C, 4D, 4E, 4F, and 4G, the a successor table 404, p successor table 406, i successor table 412, and o successor table 414 may be clustered together into a first cluster based on their common successor symbol 'p'. The y successor table 408 may be clustered into the first cluster based on both the y successor table 408 and the p successor table 406 having a common successor symbol blank, ' ', or '_'. This clustering of the a successor table 404, p successor table 406, y successor table 408, i successor table 412, and o successor table 414 may be performed based on either similar locations within the multidimensional space, or based on density of these successor tables 404, 406, 408, 412, 414 within the multidimensional space. The h successor table 402 and _ successor table 410 may be clustered into a second cluster based on either their distance from the first cluster or the lack of density of the h successor table 402 and _ successor table 410 with respect to each other or with respect to the successor tables 404, 406, 408, 412, 414 within the first cluster. The cluster tables resulting from this example clustering are shown and described with respect to FIGS. 5A and 5B.

The clusters may include symbols that are followed by similar symbols, and/or have similar frequencies of succeeding symbols. In an example in which the symbols include characters from different alphabets, characters from a first alphabet may be more likely to be followed by characters from the first alphabet, and the characters from the first alphabet may be clustered together. Characters from a second alphabet may be more likely to be followed by characters from the second alphabet, and the characters from the second alphabet may be clustered together. In an example in which the symbols include words from different languages, words from a first language (as reflected by a dictionary or lexicon of the first language which may include an index identifying each word) may be more likely to be followed by words from the first language, and the words from the first language may be clustered together. Words from a second language (as reflected by a dictionary or lexicon of the second language which may include an index identifying each word) may be more likely to be followed by words from the second language, and the words from the second language may be clustered together.

The clusterer 108 may cluster the current symbols according to a clustering algorithm. The clustering may treat the current symbols as points in multidimensional space based on their respective frequencies of succeeding symbols, with dimensions corresponding to the succeeding symbols, as discussed above. The clusterer 108 may cluster the symbols based on a predetermined number of clusters, or may determine the number of clusters after trying different numbers of clusters to determine an optimal group of codes. The optimal group of codes may be a group of codes that encodes the symbols using a lowest number of bits. Example implementations include clustering the symbols according to a K-means algorithm, a K-medoid algorithm, or stochastic optimization, with either a predetermined number of clusters or trying different numbers of clusters and selecting the number of clusters that encodes the symbols using the lowest number of bits. The clusterer 108 may also consider a cost factor of increasing the number of clusters based on computational complexity and/or increasing the header size of the packet.

The clusterer 108 may generate clusters by prototype-based clustering. The prototype-based clustering may include iteratively assigning the current symbols to clusters with similar frequencies of succeeding symbols, and updating the clusters based on the current symbols assigned to the respective cluster. In an example of clustering by K-means, the clusterer 108 may select K frequency tables as centroids. K may be any number of at least two, and may be less than ten in an example implementation. The clusterer 108 may form K clusters by assigning each current symbol to its closest centroid. The clusterer 108 may recompute the centroids based on the current symbols assigned to the respective centroids. The clusterer 108 may repeat the forming of the K clusters and recomputing of the centroids until the recomputing of the centroids changes the centroids by less than a threshold.

The clusterer 108 may also cluster the symbols by randomly trying different combinations of current symbols within the clusters, either with a predetermined number of clusters or within different numbers of clusters, encoding the symbols based on the clusters as described below, and selecting the combination of symbols in clusters that results in the smallest encoded file size. The clusterer 108 may also consider the cost factor of increasing the number of clusters based on computational complexity and/or increasing the header size of the packet in selecting the combination of symbols in clusters.

FIGS. 5A and 5B show tables with frequencies and codewords for successor symbols of clusters of current symbols according to an example implementation. In the example shown in FIG. 5A, the clusterer 108 may cluster and/or aggregate the 'a' successor table 404, the 'p' successor table 406, the 'y' successor table 410, the 'i' successor table 412, and the 'o' successor table 414 to generate a first cluster table 502. In the example shown in FIG. 5A, the current symbols 'a', 'p', 'y', 'i', and 'o', which are a subset of all of the current symbols 'h', 'a', 'p', 'y', ' ', 'i', and 'o', may be clustered together by the clusterer 108 into a first cluster. In this example described with respect to FIGS. 5A and 5B, each of the successor tables is equally weighted. However, in another example implementation, the successor tables may be weighted according to the frequencies of their respective characters within the data block 302, and the frequencies of the successor symbols may be multiplied by this weight for adding to the respective cluster table 502, 504.

As shown in FIG. 5A, the first cluster table 502 includes successor symbol 'p' with a frequency of four, successor symbol 'y' with a frequency of one, and successor symbol space, ' ', or '_' with a frequency of two. As shown in FIG. 5A, the codeword for a successor symbol 'p', which has a frequency of four occurrences in seven and occurs more than fifty percent of the time when the preceding symbol is 'a', 'p', 'y', 'i', or 'o', is a single-bit codeword of 0. The code word for successor symbol y, which has a frequency of one occurrence in seven, has a two-bit code word 10. The successor symbol space, which has a frequency of two occurrences in seven, has a two-bit code word 11. Thus, the variable length code words in the first cluster table 502 have either one or two bits.

FIG. 5B shows a second cluster table 504 according to an example implementation. In this example, the cluster table 504 has aggregated the frequencies of 'h' successor table 402 and the space successor table 410. In this example, the current symbols 'h' and space, which may be a subset of the current symbols 'h', 'a', 'p', 'y', ' ', 'i', and 'o', may be clustered together by the clusterer 108 into a second cluster. As shown in FIG. 5B, the symbol 'a', when the preceding symbol is 'h' or ' ', has a frequency of one occurrence in five and a two-bit codeword of 00. The symbol 'i,' when the preceding symbol is 'h' or ' ', has a frequency of one occurrence in five and a two-bit codeword of 01. The symbol 'o,' when the preceding symbol is 'h' or ' ', has a frequency of one occurrence in five and a two-bit codeword of 10. The symbol 'h,' when the preceding symbol is 'h' or ' ', has a frequency of two occurrences in five, and a two-bit codeword of 11.

Figure 6:
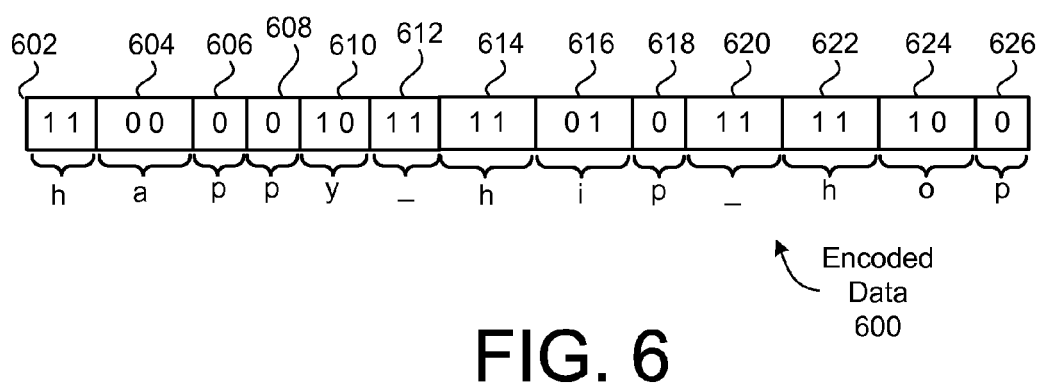
FIG. 6 is a diagram showing encoded data according to an example implementation.

FIG. 6 shows encoded data 600 according to an example implementation. In this example, the thirteen symbols shown in FIG. 3B, namely 'h', 'a', 'p', 'p', 'y', ' ', 'h' 'i', 'p', ' ', 'h', 'o', and 'p', are encoded according to the cluster tables 502, 504 shown in FIGS. 5A and 5B. Because the first symbol, the 'h' symbol 310, does not have a preceding symbol and/or does not have a context, a header of the packet that includes the encoded symbols may indicate which code and/or cluster to use to decide the first symbol. In this example, the first symbol 602 is encoded according to the second cluster table 504, with the two-bit codeword 11. The first symbol 602 may also be encoded according to a previously known code such as a fixed length code, including as ASCII or Unicode. In this example, the second symbol 604, 'a', is encoded as a succeeding symbol to h according to the code shown in the second cluster table 504, and is encoded using the two-bit codeword 00. In this example, the third symbol 606, 'p', is encoded as a succeeding symbol to the current symbol a using the first cluster table 510, and is encoded with the one-bit codeword 0. In this example, the fourth symbol 608, 'p', is encoded as a succeeding symbol to the current symbol p using the first cluster table 502, as a single-bit codeword 0. In this example, the fifth symbol 610, 'y' is encoded as a succeeding symbol to the current symbol p using the first cluster table 502, using the two-bit codeword 10. In this example, the sixth symbol 612, space, is encoded as a succeeding symbol to the current symbol y using the first cluster table 512, using the two-bit codeword 11. In this example, the seventh symbol 614, 'h', is encoded as a succeeding symbol to the current symbol space using the second cluster table 504, as the two-bit codeword 11. In this example, the eighth symbol 616, 'i' is encoded as a succeeding symbol to the current symbol h using the second cluster table 504, as the two-bit codeword 01. In this example, the ninth symbol 618, 'p', is coded as a succeeding symbol to the current symbol i using the first cluster table 502, with one-bit codeword 0. In this example, the tenth symbol 620, space, is encoded as a succeeding symbol to the current symbol p using the first cluster table 502, as two-bit codeword 11. In this example, the eleventh symbol 622, 'h', is encoded as a succeeding symbol to current symbol space using the second cluster table 504, with two-bit codeword 11. In this example, the twelfth symbol 624, 'o', is encoded as a succeeding symbol to current symbol h using the second cluster table 504, with two-bit codeword 11. In this example, the thirteenth symbol 626, 'p' is encoded as a succeeding symbol to current symbol o using the first cluster table 502, with one-bit codeword 0.

As shown in FIG. 6, the thirteen symbols are encoded using Huffman coding and context modeling with the two clusters 502, 504 with either one or two bits per symbol, for a total of twenty-two bits. By way of comparison, The thirteen symbols could also be encoded using Huffman coding without context modeling or clustering with the following frequency distributions and code:

| Symbol | Frequency | Codeword |
|--------|-----------|----------|
| h | 3 | 01 |
| a | 1 | 000 |
| p | 4 | 10 |
| y | 1 | 1111 |
| i | 1 | 001 |
| o | 1 | 1110 |
| — | 2 | 110 |

In this example, 'h', 'a', 'p', 'p', 'y', ' ', 'p', ' ', 'h', 'o', 'p' could be encoded as follows:

01  000  10  10  1111  110  01  001  10  110  01  1110  10

Encoding 'h', 'a', 'p', 'p', 'y', ' ', 'p', ' ', 'h', 'o', 'p' with the single variable-length code above requires thirty-four bits, as shown above. As shown and discussed above with respect to FIG. 6, the encoding using Huffman coding and context modeling with the two clusters 502, 504 required only twenty-two bits, a savings of more than one third. While the encoding using Huffman coding and context modeling with the two clusters 502, 504 may require a larger header file to show the frequencies of symbols for the two clusters, the encoding based on context or preceding symbols and clusters may reduce the number of bits required to represent and/or transmit data.

Figure 7:
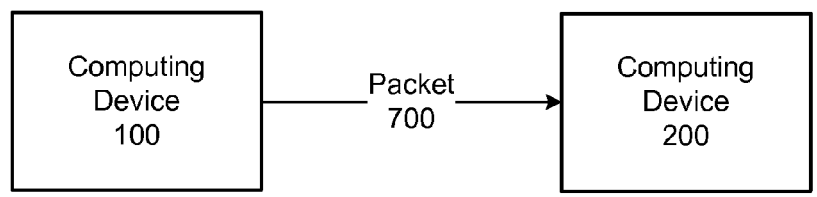
FIG. 7 shows a communication system with the computing device of FIG. 1 sending a packet to the computing device of FIG. 2 according to an example implementation.

FIG. 7 shows a communication system with the computing system 100 sending a packet to the computing system 200 according to an example implementation. The computing system 100 may generate and send a packet 700 to the computing system 200. The computing system 100 may have generated the packet 700 by generating frequency tables or frequencies for symbols, generating clusters, aggregating the frequencies in the clusters, generating codes for the clusters based on the frequencies, and encoding current symbols based on the codes for the preceding symbols. The computing system 100 may send the packet 700 which includes the encoded data to the computing system 200. The computing system 200 may reconstruct the codes based on received frequencies, and decode the encoded data based on the reconstructed codes for the preceding symbols.

Figure 8:
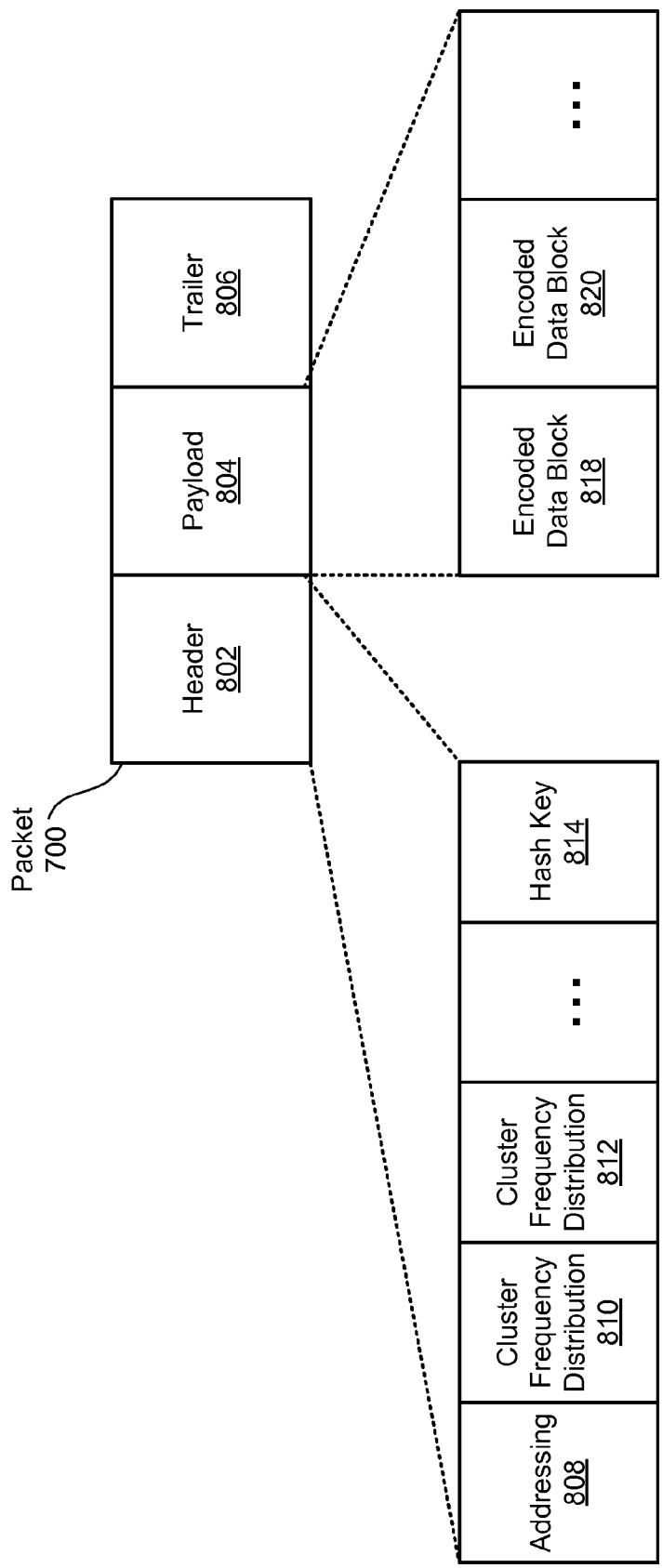
FIG. 8 is a diagram showing a packet according to an example implementation.

FIG. 8 is a diagram showing the packet 700 according to an example implementation. The packet 700 may include a header 802, a payload 804, and a trailer 806. The header 802 may include addressing fields 808, such as a source address and a destination address. The header 802 may also include multiple cluster frequency distributions 810, 812. The cluster frequency distributions 810, 812 may include the frequency distributions generated by the computing system 100 and used to generate codes, examples of which are shown in FIGS. 5A and 5B. The cluster frequency distributions 810, 812 may be used by the computing system 200 to generate the code for decoding the encoded symbols.

The header 802 may also include a hash key 814. The hash key 814 may include a hash key used to hash a preceding symbol to a cluster and/or code associated with the cluster. The hash key 814 may be used in the hash function to has one or more (such as N) previous symbols to produce the hash value. The computing system 100 and/or computing system 200 may use the hash key to hash preceding symbols to codes associated with the clusters that include the preceding symbols. The hash value may be considered the context of a symbol, and the computing system 100 will encode, or the computing system 200 will decode, the symbol based on the code associated with the context to which the preceding symbol(s) was hashed.

The payload 804 may include encoded data blocks 818, 820. The encoded data blocks 818, 820 may include the encoded symbols. An example of a portion of an encoded data block 818, 820 is shown in FIG. 6. While two encoded data blocks 818, 820 are shown in FIG. 8, the payload 804 may include any number of encoded data blocks 818, 820.

The packet 700 may also include a trailer 806. The trailer 806 may include error detection and/or correction information, such as a cyclic redundancy code (CRC).

Figure 9:
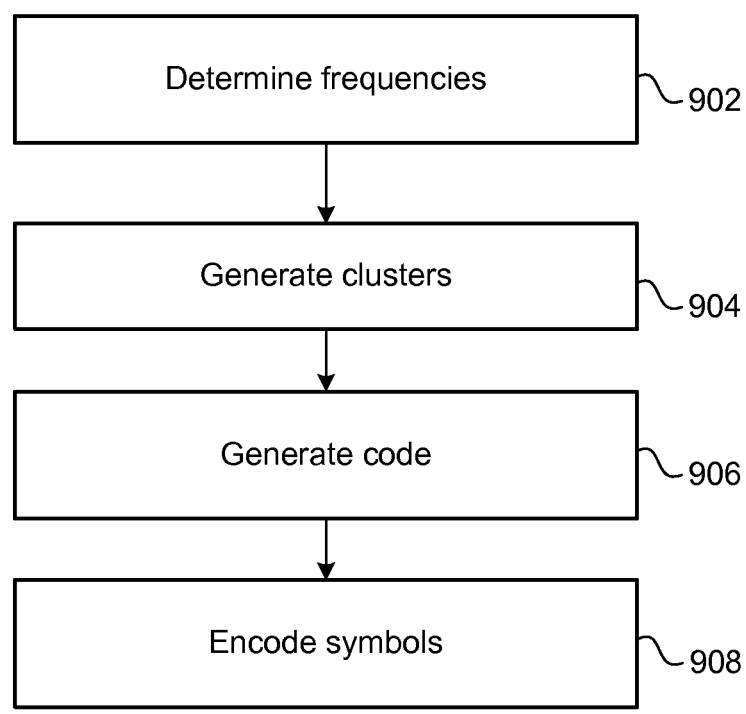
FIG. 9 is a flowchart showing a method according to an example implementation.

FIG. 9 is a flowchart showing a method performed by the computing system 100 according to an example implementation. The method may include determining, for each of a plurality of current symbols in a data block, frequencies of succeeding symbols within the data block (902). The method may include generating a plurality of clusters, each of the plurality of clusters including a subset of the plurality of current symbols (904). The method may include generating, for each of the clusters, a code, the code including variable length codewords for each of the succeeding symbols of the current symbols included in the respective cluster (906). The method may include encoding each of the succeeding symbols in the data block based on the code for the cluster that includes the succeeding symbol's respective current symbol (908).

According to an example implementation, the code for each of the clusters may be based on aggregated or summed frequencies of the succeeding symbols for the current symbols of the respective cluster.

According to an example implementation, each of the succeeding symbols may be related to a current symbol by the current symbol preceding the succeeding symbol within the data block.

According to an example implementation, each of the succeeding symbols may be related to a current symbol by the current symbol immediately preceding the succeeding symbol within the data block.

According to an example implementation, the data block may include a plurality of stateless symbols, each of the stateless symbols except a first stateless symbol in the data block and a last stateless symbol in the data block being both a current symbol with respect to a succeeding symbol that occurs later in the data block and a succeeding symbol with respect to a current symbol that occurs earlier in the data block.

According to an example implementation, the current symbols may include American Standard Code for Information Interchange (ASCII) characters.

According to an example implementation, the current symbols may include Unicode characters.

According to an example implementation, the current symbols in a first of the plurality of clusters may include characters from a first alphabet, and the current symbols in a second of the plurality of clusters include characters from a second alphabet.

According to an example implementation, the current symbols include words recognized in a dictionary or a lexicon.

According to an example implementation, the current symbols in a first of the plurality of clusters may include words recognized in a dictionary of a first language or a lexicon of the first language, and the current symbols in a second of the plurality of clusters may include words recognized in a dictionary of a second language or a lexicon of the second language.

According to an example implementation, the generating the plurality of clusters may include generating the plurality of clusters by prototype-based clustering, the prototype-based clustering including iteratively assigning the current symbols to clusters with similar frequencies of succeeding symbols and updating the clusters based on the current symbols assigned to the respective cluster.

According to an example implementation, the determining frequencies of succeeding symbols may include determining a frequency table for each current symbols, the frequency table indicating a likelihood of each succeeding symbol succeeding the current symbols. The generating the plurality of clusters may include generating the plurality of clusters by a K-means algorithm. The K-means algorithm may include selecting K frequency tables as centroids, forming K clusters by assigning each current symbol to its closest centroid, recomputing the centroids based on the current symbols assigned to the respective centroids, and repeating the forming the K clusters and recomputing the centroids until the recomputing the centroids changes the centroids by less than a threshold.

According to an example implementation, K may be less than ten.

According to an example implementation, the generating the plurality of clusters may include generating the plurality of clusters by stochastic optimization based on the frequencies of succeeding symbols.

According to an example implementation, the generating the code may include generating a Huffman code.

According to an example implementation, the encoding each of the plurality of succeeding symbols may include hashing each of the succeeding symbols' respective current symbols to the cluster that includes the respective current symbol.

According to an example implementation, the frequencies of succeeding symbols may be determined for combinations of the current symbols and at least one preceding symbol. The clusters may have similar frequencies of succeeding symbols for the combinations of the current symbols and the at least one preceding symbol. The codes may include variable length codewords for each of the succeeding symbols of the combination of the current symbols and at least one preceding symbol included in the respective cluster. The encoding may include encoding each of the succeeding symbols in the data block based on the code for the cluster that includes the succeeding symbol's respective current symbol and at least one preceding symbol.

According to an example implementation, the method may further include generating at least one packet. The at least one packet may include a header including the frequency distributions of the succeeding symbols of the current symbols for each of the clusters, and a payload including the encoded symbols.

According to an example implementation, the method may further include sending the at least one packet to a receiving computing device.

Figure 10:
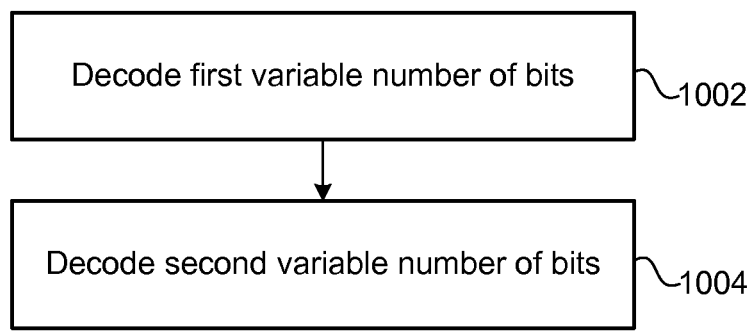
FIG. 10 is a flowchart showing a method according to another example implementation.

FIG. 10 is a flowchart showing a method performed by the computing system 200 according to another example implementation. The method may include decoding a first variable number of bits that encode a current symbol based on a first code, the first code being associated with a first plurality of symbols including a previously decoded symbol that was decoded before the current symbol (1002). The method may also include decoding a second variable number of bits that encode a succeeding symbol based on a second code, the second code being associated with a second plurality of symbols including the current symbol but not the previously decoded symbol (1004).

According to an example implementation, the second variable number of bits may be subsequent to the first variable number of bits within a received data block.

According to an example implementation, the second variable number of bits may be immediately subsequent to the first variable number of bits within a received data block and the succeeding symbol is immediately subsequent to the current symbol.

According to an example implementation, the method may further include hashing the previously decoded symbol to the first code.

According to an example implementation, the method may further include determining the first code based on a first received frequency distribution and determining the second code based on a second received frequency distribution.

Figure 11:
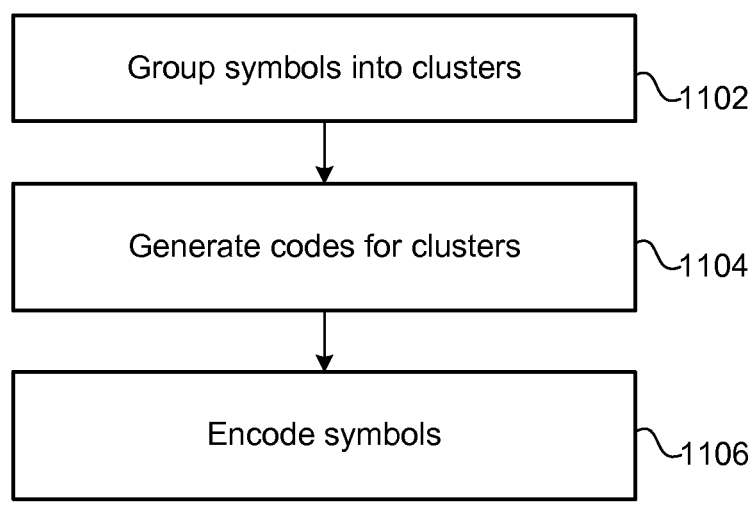
FIG. 11 is a flowchart showing a method according to another example implementation.

FIG. 11 is a flowchart showing a method performed by the computing system 100 according to another example implementation. The method may include grouping current symbols from a first data block into a first plurality of clusters based on frequency distributions of succeeding symbols within the first data block (1102). The method may also include generating entropy codes for each of the first plurality of clusters based on frequency distributions of the succeeding symbols of the current symbols in the respective cluster (1104). The method may also include encoding the succeeding symbols from the first data block based on the entropy codes of the clusters of their respective current symbols within the first data block (1106).

According to an example implementation, the method may further include generating at least one packet. The at least one packet may include a header including the frequency distributions of the succeeding symbols of the current symbols for each of the clusters, and a payload including the encoded symbols.

According to an example implementation, the method may further include grouping symbols from a second data block into a second plurality of clusters based on frequency distributions of succeeding symbols within a second data block. The frequency distributions of succeeding symbols within the second data block may be different than the frequency distributions of succeeding symbols within the first data block. The method may further include generating entropy codes for each of the second plurality of clusters based on frequency distributions of the succeeding symbols of the current symbols in the respective cluster. The method may further include encoding the symbols from the second data block based on the entropy code of the clusters of their respective preceding symbols within the second data block.

The non-transitory computer-readable storage medium of claim 26, wherein the instructions are further configured to cause the computing system to encode symbols from a third data block based on the entropy codes of the clusters of the second data block.

Figure 12:
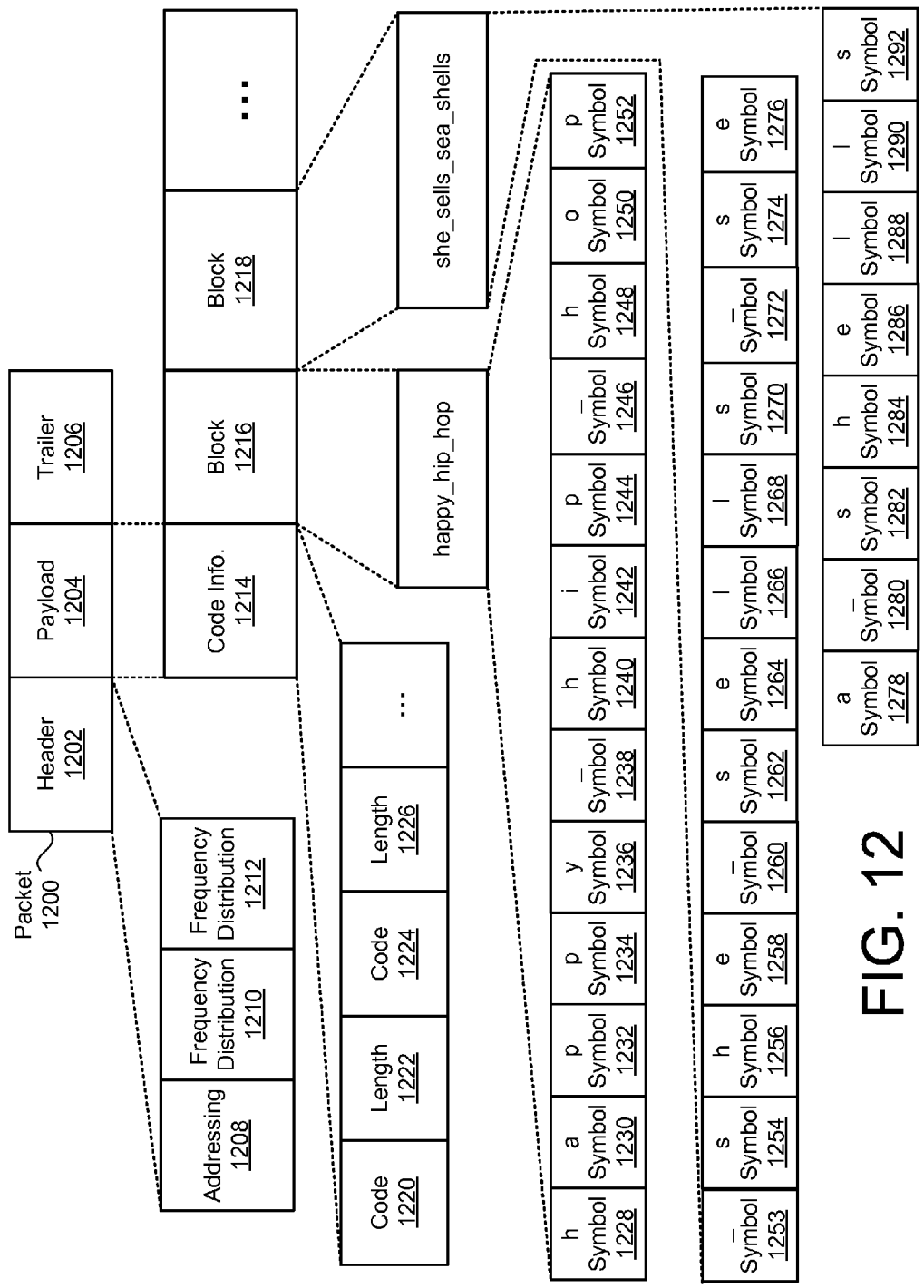
FIG. 12 is a diagram showing a packet according to an example implementation.

FIG. 12 is a diagram of a packet 1200 including data that has been encoded based on different codes for each block of data according to an example implementation. In an example implementation, data may be partitioned into blocks with similar symbols. In an example implementation, the blocks may include data that came from a same source, such as a first block coming from a first source that generated a message in English, a second block coming from a second source that generated a message in Chinese, and a third block coming from a third source that wrote computer code, such as code in C++. In another example, the blocks may include data that came from a same source, but have characters with different frequency distributions.

A computing system may divide the data into blocks, and use one code, such as an entropy code such as Huffman coding, to encode each block. The computing system may determine where to divide and/or partition the data into the blocks based on encoding and/or decoding costs. In determining the costs, and/or minimizing the costs, the computing system may determine the cost and/or efficiency of codes in encoding different portions of the data, a cost of switching codes, and/or a cost of including the codes and/or frequency distributions used to construct the codes in the packet(s).

In the example shown in FIG. 12, a packet 1200 generated and/or sent by the computing system includes a header 12002, a payload 1204, and a trailer 1206. The header 1202 may include addressing information 1208 such as a source address and destination address. The header 1202 may also include two or more frequency distributions 1210, 1212. The frequency distributions 1210, 1212 may include frequency distributions of symbols in the blocks. The computing system may have used the frequency distributions 1210, 1212 to construct the code used to encode the data in each of the blocks, and the receiving device may use the frequency distributions 1210, 1212 to re-construct the code to decode the data in each of the blocks. In an example in which the same code is used for more than one block, the number of frequency distributions 1210, 1212 may be less than the number of blocks; in an example in which each block uses a different code, the number of frequency distributions 1210, 1212 may be equal to the number of blocks.

The payload 1204 may include code information 1214 and at least two blocks 1216, 1218. The blocks 1216, 1218 may have different lengths. The packet 1200 may include multiple blocks, a packet may include one block, or a block may be distributed among multiple packets. The code information 1214 may include pairs of code identifiers 1220, 1224 and lengths 1222, 1226. The code identifiers 1220, 1224 may identify a code used for a particular block, and the length 1222, 1226 may indicate a length, such as a number of bytes, of the block which uses the identified code until the next block begins. A code may be associated with a frequency distribution 1210, 1212. For example, the code identifier 1220 may identify the code associated with the first frequency distribution 1210, and the length 1222 may indicate a length of a block that uses the code associated with the first frequency distribution 1210. The code identifier 1224 may identify the code associated with the second frequency distribution 1212, and the length 1226 may indicate a length of a block that uses the code associated with the second frequency distribution.

In an example implementation, the payload 1204 may interleave the blocks 1216, 1218 with the code information 1214. For example, the payload 1204 may include a first code identifier 1220 followed by a first length 1222 of the first block 1216 encoded using the identified code, and the first block 1216 of encoded data with the length indicated by the length 1222 field. The first clock 1216 of encoded data may be followed by a second code identifier 1224 identifying the code used to encode the second block 1218 of encoded data, the length 1226 field indicating the length of the second block 1218, and the second block with the indicated length.

In an example implementation, the computing system may use the code associated with the first frequency distribution 1210 to encode a first block 1216, which includes symbol 'h' 1228, symbol 'a' 1230, symbol 'p' 1232, symbol 'p' 1234, symbol 'y' 1236, symbol ' ' 1238, symbol 'h' 1240, symbol 'i' 1242, symbol 'p' 1244, symbol ' ' 1246, symbol 'h' 1248, symbol 'o' 1250, symbol 'p' 1252, spelling "happy hip hop". The computing system may use the code associated with the second frequency distribution 1212 to encode a second block 1218, which includes symbol 's' 1254, symbol 'h' 1256, symbol 'e' 1258, symbol ' ' 1260, symbol 's' 1262, symbol 'e' 1264, symbol 'l' 1266, symbol 'l' 1268, symbol 's' 1270, symbol ' ' 1272, symbol 's' 1274, symbol 'e' 1276, symbol 'a' 1278, symbol ' ' 1280, symbol 's' 1282, symbol 'h' 1284, symbol 'e' 1286, symbol 'l' 1288, symbol 'l' 1290, and symbol 's', spelling "she sells sea shells". A space, ' ', or '_' may be included in either of the blocks 1216, 1218; in the example shown in FIG. 12, the space is included as a first symbol in the second block 1218. The computing system may have determined to partition the blocks 1216, 1218 based on their differing frequency distributions and the resulting increased efficiency of using different codes for the two blocks 1216, 1218.

In an example in which "happy hip hop she sells sea shells" is included in a single block with a single code, the frequency distribution, code, and encoded data may require 111 bits, as shown below:

| Symbol | Frequency | Codeword |
|---|---|---|
| h | 5 | 101 |
| a | 2 | 11011 |
| p | 4 | 100 |
| y | 1 | 11010 |
| — | 6 | 111 |
| i | 1 | 11000 |
| o | 1 | 11001 |
| s | 6 | 00 |
| e | 4 | 010 |
| l | 4 | 011 |

101 11011 100    100 11010 111 101 11000 100    111    101 11001
100 111    00    101 010    111 00  010    11001 11001 00 111
00  010    11011 111 00     101 010 011    011    00

As discussed above, compressing "happy hip hop" in the first block 1216 using Huffman coding with one (first) code requires thirty-four bits. Compressing "she sells sea shells" in the second block 1218 using Huffman coding with one (second) code requires fifty-two bits:

| Symbol | Frequency | Codeword |
|---|---|---|
| s | 6 | 10 |
| h | 2 | 1101 |
| e | 4 | 00 |
| — | 4 | 111 |
| l | 4 | 01 |
| a | 1 | 1100 |

111 10 1101 00  111 10   00 01 01 10 111
10  00 1100 111 10  1101 00 01 01 10

The total number of bits to encode "happy hip hop she sells sea shells" in two blocks 1216, 1218 with two different codes, eighty-six bits, is more than one-fifth lower than the 111 bits to encode "happy hip hop she sells sea shells" with one code.

As discussed above, the encoding can be performed by the computing system splitting the data into blocks, and assuming that different sources are modeled in different blocks, and have one entropy code per block. An adaptive context (for example a last byte or n-gram) may define separations of blocks 1216, 1218 to the entropy code. The computing system may use heuristic or greedy methods to split block into N smaller blocks, and keep splitting as long as the splitting creates savings by reducing the number of bytes required to represent the data, and the savings exceeds the costs of changing codes.

Figure 13:
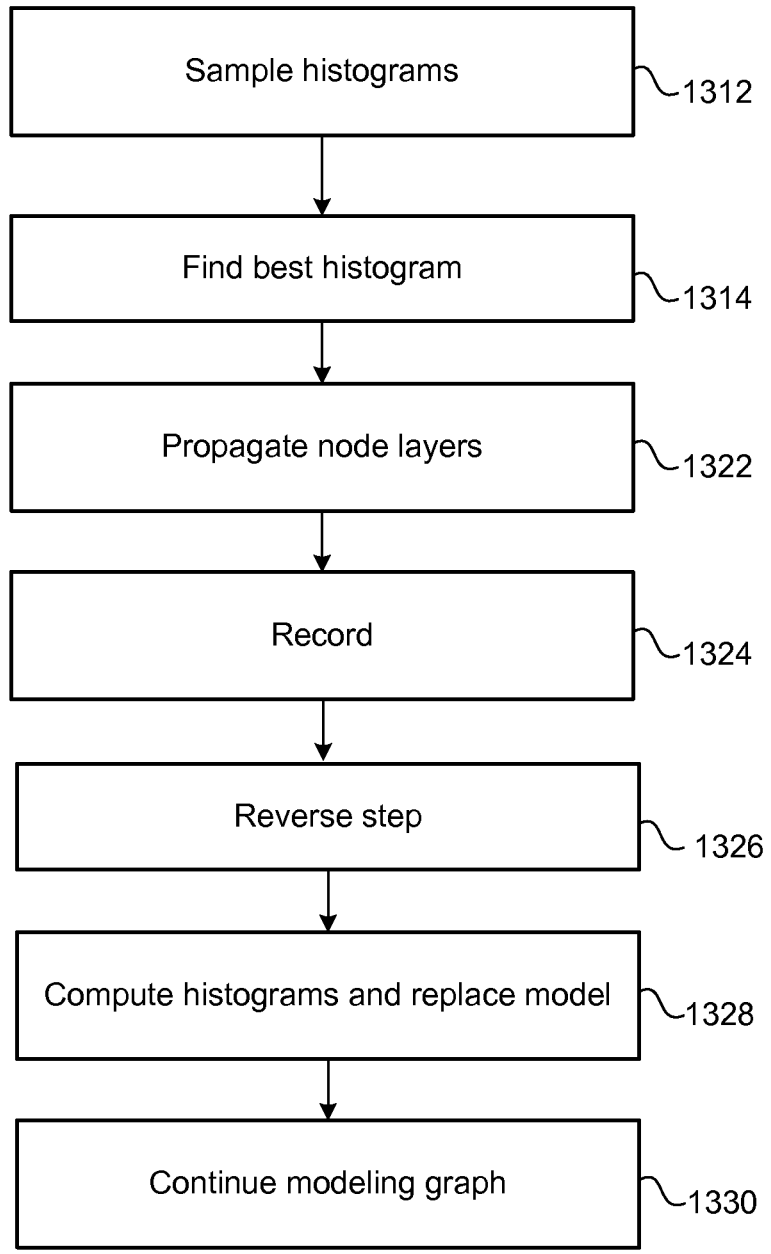
FIG. 13 is a flowchart showing a method according to an example implementation.

In an example implementation, an algorithm described with respect to FIGS. 12 and 13 may optimally solve a block selection problem in O(n)*O(blocktypes) time, in an optimal manner given a constant cost to switch between blocks. The computing system may determine the optimal solution in a time that is possible to use in a compression algorithm FIG. 13 is a flowchart showing an algorithm 1300 performed by the computing system to generate the packet 1200 shown in FIG. 12 according to an example implementation. The algorithm 1300 may include randomly sampling A short histograms from evenly sampled distances of B consequent literals (where A and B may be small integers, such as A~100, and B~70) (1312).

The algorithm 1300 may also include randomly sampling ranges of B symbols, and finding the best histogram from A that would describe B+A with the least amount of entropy (1314). The computing system may refine this histogram by adding the literals in the selected random sample into it. Functions 1312 and 1314 may build an initial working model of the entropy sources.

Functions 1322, 1324, 1326, 1328, and 1330, described below, may model a graph by using the current working model, where nodes are between literals, and the links are the encoding bit costs of the literals. The computing system may use a shortest path algorithm to find the best transitions.

The algorithm may, while maintaining a smallest sum value and its respective index, propagate at each node layer by adding the encoding costs from the link to the respective value of the previous layer the current bit cost values from one layer to the next either from their respective block type or from the optimal block type (1322).

The algorithm may include recording the best way to reach this literal, such as the past block type to reach this position, from at each iteration (1324), such as at each performance of 1322.

The algorithm may include reverse stepping from the back, by looking at what is the lowest bit cost blocktype at the last literal, and reversing step to the previous best block type (1326). The algorithm may include recording transformations from one block type to another, with the transformations being considered the block boundaries.

The algorithm may include computing histograms for blocktypes, and replacing the working model of entropy by the histograms of the block types (1328).

The algorithm may include repeating 1322, 1324, 1326, 1328 multiple times (1330), such as between three and ten times.

In an example implementation, the same block type may be used by multiple blocks. The entropy source may be modeled once, and reused by recalling the entropy source, frequency distribution, and/or code, by its identification code.

Different data, such as data for an LZ77 converted data, including literals, distances, and lengths, may be split into different blocks. A compression command structure, where each block includes data such as a number of literals, literals, length of copy, and/or length of distances, may have its entropy modeled by separate entropy sources, and perform block splitting separately. In an example implementation, a joint entropy model may be generated for a number of literals and length of copy, and block splitting may be performed for the joint model.

The algorithm may provide the block boundary positions and labels. The block boundary positions and labels may be used directly for the entropy model, or refined further by more exact and slower algorithms by using stochastic clustering.

This algorithm may use block identifiers, and efficient reuse of block codes may be efficient if the input data is first chunked into larger blocks, such as 164 MB, which may be referred to as 'metablocks', and the entropy source selection may be run separately for the metablocks. In an example implementation, another algorithm may be used to select the metablocks, or the same algorithm may be used to select the metablocks, such as by assigning a higher block switch cost. In an example implementation, the points of block switch may be reduced, such as every 256 kB. If the input is streaming, heuristic methods may be used for determining metablock splitting.

In an example implementation, an estimate of $\log_2$(total) $\log_2$(symbol_population_count) may be used to determine a bit cost for an entropy model. However, with candidate entropy models, symbols where there is no such symbol in the entropy model may be compared. Where there is no such symbol, a cost of $\log_2$(total)+bias-value, where bias-value is around two may be used.

Figure 14:
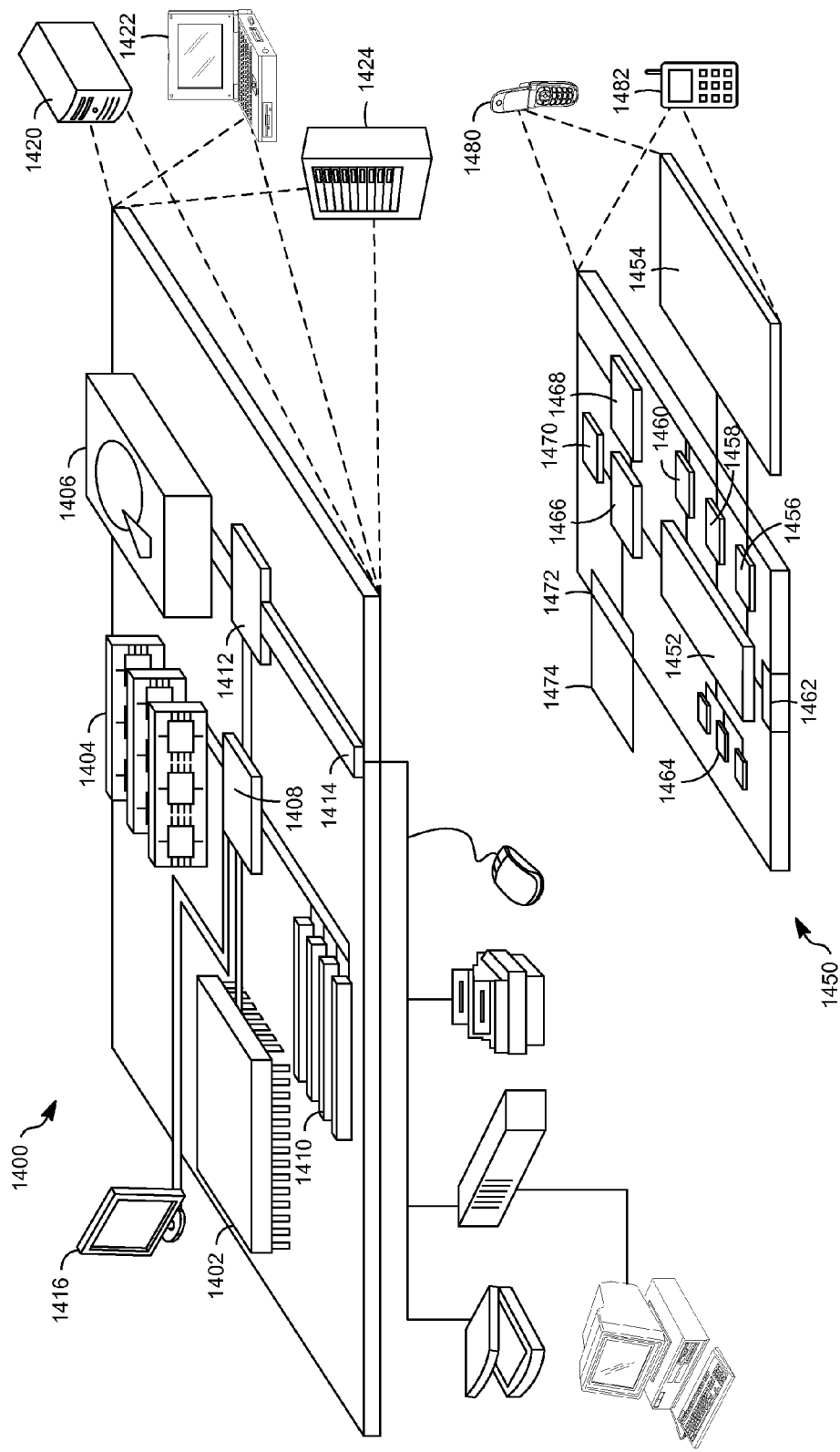
FIG. 14 shows an example of a generic computer device and a generic mobile computer device which may be used with the techniques described herein.

FIG. 14 shows an example of a generic computer device 1400 and a generic mobile computer device 1450, which may be used with the techniques described herein. Computing device 1400 is intended to represent various forms of digital computers, such as laptops, desktops, workstations, personal digital assistants, servers, blade servers, mainframes, and other appropriate computers. Computing device 1450 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 1400 includes a processor 1402, memory 1404, a storage device 1406, a high-speed interface 1408 connecting to memory 1404 and high-speed expansion ports 1410, and a low speed interface 1412 connecting to low speed bus 1414 and storage device 1406. Each of the components 1402, 1404, 1406, 1408, 1410, and 1412, are interconnected using various busses, and may be mounted on a common motherboard or in other manners as appropriate. The processor 1402 can process instructions for execution within the computing device 1400, including instructions stored in the memory 1404 or on the storage device 1406 to display graphical information for a GUI on an external input/output device, such as display 1416 coupled to high speed interface 1408. In other implementations, multiple processors and/or multiple buses may be used, as appropriate, along with multiple memories and types of memory. Also, multiple computing devices 1400 may be connected, with each device providing portions of the necessary operations (e.g., as a server bank, a group of blade servers, or a multi-processor system).

The memory 1404 stores information within the computing device 1400. In one implementation, the memory 1404 is a volatile memory unit or units. In another implementation, the memory 1404 is a non-volatile memory unit or units. The memory 1404 may also be another form of computer-readable medium, such as a magnetic or optical disk.

The storage device 1406 is capable of providing mass storage for the computing device 1400. In one implementation, the storage device 1406 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 1404, the storage device 1406, or memory on processor 1402.

The high speed controller 1408 manages bandwidth-intensive operations for the computing device 1400, while the low speed controller 1412 manages lower bandwidth-intensive operations. Such allocation of functions is exemplary only. In one implementation, the high-speed controller 1408 is coupled to memory 1404, display 1416 (e.g., through a graphics processor or accelerator), and to high-speed expansion ports 1410, which may accept various expansion cards (not shown). In the implementation, low-speed controller 1412 is coupled to storage device 1406 and low-speed expansion port 1414. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 1400 may be implemented in a number of different forms, as shown in the figure. For example, it may be implemented as a standard server 1420, or multiple times in a group of such servers. It may also be implemented as part of a rack server system 1424. In addition, it may be implemented in a personal computer such as a laptop computer 1422. Alternatively, components from computing device 1400 may be combined with other components in a mobile device (not shown), such as device 1450. Each of such devices may contain one or more of computing device 1400, 1450, and an entire system may be made up of multiple computing devices 1400, 1450 communicating with each other.

Computing device 1450 includes a processor 1452, memory 1464, an input/output device such as a display 1454, a communication interface 1466, and a transceiver 1468, among other components. The device 1450 may also be provided with a storage device, such as a microdrive or other device, to provide additional storage. Each of the components 1450, 1452, 1464, 1454, 1466, and 1468, are interconnected using various buses, and several of the components may be mounted on a common motherboard or in other manners as appropriate.

The processor 1452 can execute instructions within the computing device 1450, including instructions stored in the memory 1464. The processor may be implemented as a chipset of chips that include separate and multiple analog and digital processors. The processor may provide, for example, for coordination of the other components of the device 1450, such as control of user interfaces, applications run by device 1450, and wireless communication by device 1450.

Processor 1452 may communicate with a user through control interface 1458 and display interface 1456 coupled to a display 1454. The display 1454 may be, for example, a TFT LCD (Thin-Film-Transistor Liquid Crystal Display) or an OLED (Organic Light Emitting Diode) display, or other appropriate display technology. The display interface 1456 may comprise appropriate circuitry for driving the display 1454 to present graphical and other information to a user. The control interface 1458 may receive commands from a user and convert them for submission to the processor 1452. In addition, an external interface 1462 may be provide in communication with processor 1452, so as to enable near area communication of device 1450 with other devices. External interface 1462 may provide, for example, for wired communication in some implementations, or for wireless communication in other implementations, and multiple interfaces may also be used.

The memory 1464 stores information within the computing device 1450. The memory 1464 can be implemented as one or more of a computer-readable medium or media, a volatile memory unit or units, or a non-volatile memory unit or units. Expansion memory 1474 may also be provided and connected to device 1450 through expansion interface 1472, which may include, for example, a SIMM (Single In Line Memory Module) card interface. Such expansion memory 1474 may provide extra storage space for device 1450, or may also store applications or other information for device 1450. Specifically, expansion memory 1474 may include instructions to carry out or supplement the processes described above, and may include secure information also. Thus, for example, expansion memory 1474 may be provide as a security module for device 1450, and may be programmed with instructions that permit secure use of device 1450. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 1464, expansion memory 1474, or memory on processor 1452, that may be received, for example, over transceiver 1468 or external interface 1462.

Device 1450 may communicate wirelessly through communication interface 1466, which may include digital signal processing circuitry where necessary. Communication interface 1466 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 1468. In addition, short-range communication may occur, such as using a Bluetooth, WiFi, or other such transceiver (not shown). In addition, GPS (Global Positioning System) receiver module 1470 may provide additional navigation- and location-related wireless data to device 1450, which may be used as appropriate by applications running on device 1450.

Device 1450 may also communicate audibly using audio codec 1460, which may receive spoken information from a user and convert it to usable digital information. Audio codec 1460 may likewise generate audible sound for a user, such as through a speaker, e.g., in a handset of device 1450. Such sound may include sound from voice telephone calls, may include recorded sound (e.g., voice messages, music files, etc.) and may also include sound generated by applications operating on device 1450.

The computing device 1450 may be implemented in a number of different forms, as shown in the figure. For example, it may be implemented as a cellular telephone 1480. It may also be implemented as part of a smart phone 1482, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any non-transitory computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of embodiments have been described. Nevertheless, it will be understood that various modifications may be made without departing from the spirit and scope of the invention.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. A non-transitory computer-readable storage medium comprising instructions stored thereon that, when executed by at least one processor, are configured to cause a computing system to at least:

determine, for each of a plurality of current symbols in a data block, frequencies of succeeding symbols within the data block;

generate a plurality of clusters, each of the plurality of clusters including a subset of the plurality of current symbols;

generate, for each of the clusters, a code, the code including variable length codewords for each of the succeeding symbols of the current symbols included in the respective cluster; and encode each of the succeeding symbols in the data block based on the code for the cluster that includes the succeeding symbol's respective current symbol.

2. The non-transitory computer-readable storage medium of claim 1, wherein each of the succeeding symbols is related to a current symbol by the current symbol preceding the succeeding symbol within the data block.

3. The non-transitory computer-readable storage medium of claim 1, wherein each of the succeeding symbols is related to a current symbol by the current symbol immediately preceding the succeeding symbol within the data block.

4. The non-transitory computer-readable storage medium of claim 1, wherein the data block includes a plurality of stateless symbols, each of the stateless symbols except a first stateless symbol in the data block and a last stateless symbol in the data block being both a current symbol with respect to a succeeding symbol that occurs later in the data block and a succeeding symbol with respect to a current symbol that occurs earlier in the data block.

5. The non-transitory computer-readable storage medium of claim 1, wherein the current symbols include American Standard Code for Information Interchange (ASCII) characters.

6. The non-transitory computer-readable storage medium of claim 1, wherein the current symbols include Unicode characters.

7. The non-transitory computer-readable storage medium of claim 1, wherein:
the current symbols in a first of the plurality of clusters include characters from a first alphabet; and
the current symbols in a second of the plurality of clusters include characters from a second alphabet.

8. The non-transitory computer-readable storage medium of claim 1, wherein the current symbols include words recognized in a dictionary or a lexicon.

9. The non-transitory computer-readable storage medium of claim 1, wherein:
the current symbols in a first of the plurality of clusters include words recognized in a dictionary of a first language or a lexicon of the first language; and
the current symbols in a second of the plurality of clusters includes words recognized in a dictionary of a second language or a lexicon of the second language.

10. The non-transitory computer-readable storage medium of claim 1, wherein the generating the plurality of clusters includes generating the plurality of clusters by prototype-based clustering, the prototype-based clustering including iteratively assigning the current symbols to clusters with similar frequencies of succeeding symbols and updating the clusters based on the current symbols assigned to the respective cluster.

11. The non-transitory computer-readable storage medium of claim 1, wherein:
the determining frequencies of succeeding symbols includes determining a frequency table for each current symbols, the frequency table indicating a likelihood of each succeeding symbol succeeding the current symbols; and
the generating the plurality of clusters includes generating the plurality of clusters by a K-means algorithm, the K-means algorithm including:
selecting K frequency tables as centroids;
forming K clusters by assigning each current symbol to its closest centroid;
recomputing the centroids based on the current symbols assigned to the respective centroids; and
repeating the forming the K clusters and recomputing the centroids until the recomputing the centroids changes the centroids by less than a threshold.

12. The non-transitory computer-readable storage medium of claim 11, wherein K is less than ten.

13. The non-transitory computer-readable storage medium of claim 1, wherein the generating the plurality of clusters includes generating the plurality of clusters by stochastic optimization based on the frequencies of succeeding symbols.

14. The non-transitory computer-readable storage medium of claim 1, wherein the generating the code includes generating a Huffman code.

15. The non-transitory computer-readable storage medium of claim 1, wherein the encoding each of the plurality of succeeding symbols includes hashing each of the succeeding symbols' respective current symbols to the cluster that includes the respective current symbol.

16. The non-transitory computer-readable storage medium of claim 1, wherein:
the frequencies of succeeding symbols are determined for combinations of the current symbols and at least one preceding symbol;
the clusters have similar frequencies of succeeding symbols for the combinations of the current symbols and the at least one preceding symbol;
the codes include variable length codewords for each of the succeeding symbols of the combination of the current symbols and at least one preceding symbol included in the respective cluster; and
the encoding includes encoding each of the succeeding symbols in the data block based on the code for the cluster that includes the succeeding symbol's respective current symbol and at least one preceding symbol.

17. The non-transitory computer-readable storage medium of claim 1, wherein the instructions are further configured to cause the computing system to generate at least one packet, the at least one packet including:
a header including the frequency distributions of the succeeding symbols of the current symbols for each of the clusters; and
a payload including the encoded symbols.

18. The non-transitory computer-readable storage medium of claim 17, wherein the instructions are further configured to cause the computing system to send the at least one packet to a receiving computing device.

19. A non-transitory computer-readable storage medium comprising instructions stored thereon that, when executed by at least one processor, are configured to cause a computing system to at least:
decode a first variable number of bits that encode a current symbol based on a first code, the first code being associated with a first plurality of symbols including a previously decoded symbol that was decoded before the current symbol; and decode a second variable number of bits that encode a succeeding symbol based on a second code, the second code being associated with a second plurality of symbols including the current symbol but not the previously decoded symbol.

20. The non-transitory computer-readable storage medium of claim 19, wherein the second variable number of bits is subsequent to the first variable number of bits within a received data block.

21. The non-transitory computer-readable storage medium of claim 19, wherein the second variable number of bits is immediately subsequent to the first variable number of bits within a received data block and the succeeding symbol is immediately subsequent to the current symbol.

22. The non-transitory computer-readable storage medium of claim 19, wherein the instructions are further configured to cause the computing system to hash the previously decoded symbol to the first code.

23. The non-transitory computer-readable storage medium of claim 19, wherein the instructions are further configured to cause the computing system to determine the first code based on a first received frequency distribution and determine the second code based on a second received frequency distribution.

24. A non-transitory computer-readable storage medium comprising instructions stored thereon that, when executed by at least one processor, are configured to cause a computing system to at least:
group current symbols from a first data block into a first plurality of clusters based on frequency distributions of succeeding symbols within the first data block;
generate entropy codes for each of the first plurality of clusters based on frequency distributions of the succeeding symbols of the current symbols in the respective cluster; and
encode the succeeding symbols from the first data block based on the entropy codes of the clusters of their respective current symbols within the first data block.

25. The non-transitory computer-readable storage medium of claim 24, wherein the instructions are further configured to cause the computing system to generate at least one packet, the at least one packet including:
a header including the frequency distributions of the succeeding symbols of the current symbols for each of the clusters; and
a payload including the encoded symbols.

26. The non-transitory computer-readable storage medium of claim 24, wherein the instructions are further configured to cause the computing system to:
group symbols from a second data block into a second plurality of clusters based on frequency distributions of succeeding symbols within a second data block, the frequency distributions of succeeding symbols within the second data block being different than the frequency distributions of succeeding symbols within the first data block;
generate entropy codes for each of the second plurality of clusters based on frequency distributions of the succeeding symbols of the current symbols in the respective cluster; and
encode the symbols from the second data block based on the entropy code of the clusters of their respective preceding symbols within the second data block.

27. The non-transitory computer-readable storage medium of claim 26, wherein the instructions are further configured to cause the computing system to encode symbols from a third data block based on the entropy codes of the clusters of the second data block.

* * * * *